US011861629B2

(12) United States Patent
Tomarkin

(10) Patent No.: US 11,861,629 B2
(45) Date of Patent: Jan. 2, 2024

(54) GLOBAL URBANICITY MEASUREMENT MACHINE AND METHOD

(71) Applicant: Acxiom LLC, Conway, AR (US)

(72) Inventor: Craig Tomarkin, Fairfield, CT (US)

(73) Assignee: Acxiom LLC, Conway, AR (US)

( * ) Notice: Subject to any disclaimer, the term of this patent is extended or adjusted under 35 U.S.C. 154(b) by 687 days.

(21) Appl. No.: 17/048,786

(22) PCT Filed: Nov. 16, 2018

(86) PCT No.: PCT/US2018/061514
§ 371 (c)(1),
(2) Date: Oct. 19, 2020

(87) PCT Pub. No.: WO2019/203897
PCT Pub. Date: Oct. 24, 2019

(65) Prior Publication Data
US 2021/0182444 A1    Jun. 17, 2021

Related U.S. Application Data

(60) Provisional application No. 62/660,785, filed on Apr. 20, 2018.

(51) Int. Cl.
*G06Q 50/26* (2012.01)
*G06N 7/01* (2023.01)
(Continued)

(52) U.S. Cl.
CPC ......... *G06Q 30/0201* (2013.01); *G06F 30/10* (2020.01); *G06N 7/01* (2023.01); *G06Q 50/26* (2013.01)

(58) Field of Classification Search
CPC ..... G06Q 30/0201; G06Q 50/26; G06F 30/10; G06N 7/01
See application file for complete search history.

(56) References Cited

U.S. PATENT DOCUMENTS 6,834,252 B2    12/2004    Yokota
7,844,417 B2    11/2010    Du
(Continued)

FOREIGN PATENT DOCUMENTS

CN    103218517 B    7/2013
WO    2013118682 A1    8/2013

OTHER PUBLICATIONS

Shen G. Fractal dimension and fractal growth of urbanized areas. International Journal of Geographical Information Science. Jul. 1, 2002;16(5):419-37. (Year: 2002).*

(Continued)

*Primary Examiner* — Chuen-Meei Gan

(57) ABSTRACT

In a system and method for measuring global urbanicity, trapezoid shapes are built based on latitude/longitude boundaries using two different scales in two dimensions, thus yielding four different shapes/sizes of trapezoids. A multiplier is applied to adjust the count within a trapezoid to compensate for the fact that these trapezoids delineated by latitude/longitude lines will diminish in size as they approach the poles of the Earth. Census data is applied from a given country, and then summed up using an external data set pertaining to counts. Finally, the counts are rolled up into a set number of urbanicity "bands" or levels as desired for a particular application.

15 Claims, 2 Drawing Sheets

(51) Int. Cl.
*G06Q 30/0201* (2023.01)
*G06F 30/10* (2020.01)

(56) References Cited

U.S. PATENT DOCUMENTS

| | | | |
|---|---|---|---|
| 8,478,289 | B1 | 7/2013 | Lookingbill et al. |
| 8,612,176 | B2 | 12/2013 | Gilbert |
| 8,948,927 | B1 | 2/2015 | Piponi |
| 9,418,337 | B1 | 8/2016 | Elser et al. |
| 9,672,424 | B2 | 6/2017 | Gueguen |
| 2012/0218150 | A1 | 8/2012 | Oyabu et al. |
| 2014/0365246 | A1 | 12/2014 | Hayward et al. |
| 2016/0358190 | A1* | 12/2016 | Terrazas .................. G06F 18/22 |
| 2017/0228748 | A1 | 8/2017 | Shibayama et al. |
| 2017/0248434 | A1 | 8/2017 | Best |

OTHER PUBLICATIONS

Li G, Weng Q. Using Landsat ETM+ imagery to measure population density in Indianapolis, Indiana, USA. Photogrammetric Engineering & Remote Sensing. Aug. 1, 2005;71(8):947-58. (Year: 2005).*

Azar et al., "Generation of Fine-Scale Population Layers Using Multi-Resolution Satellite Imagery and Geospatial Data," 130 Remote Sensing of Environment 219-232 (2013).

Holt et al., "Dasymetric Estimation of Population Density and Areal Interpolation of Census Data," 31 Cartography and Geographic Information Science, No. 2, pp. 103-121 (2004).

Balk et al., "Determining Global Population Distribution: Methods, Applications and Data," Adv Parasitol. 62, 119-156 (2006).

Li et al., "Using Landsat ETM + Imagery to Measure Population Density in Indianapolis, Indiana, USA," Photogrammetric Engineering and Remote Sensing (Aug. 2005).

* cited by examiner

GLOBAL URBANICITY MEASUREMENT MACHINE AND METHOD

TECHNICAL FIELD

The invention is in the field of improving population count products by measuring and assigning human population densities, and particular to the field of assigning population densities on a worldwide basis regardless of whether a particular country collects census-type information.

BACKGROUND

"Urbanicity" may be defined for purposes herein as the level of population density in a given area; more urban areas have a greater population density (i.e., residents per unit of area), whereas more rural areas have a lower population density. Determining population density is highly relevant to a number of fields, including, for example, targeted marketing. The urbanicity of a particular consumer is informative of certain likely demographic and purchasing propensity data related to the consumer, and thus urbanicity allows the marketer to infer certain traits about the consumer based upon the urbanicity of the consumer's residential area. An accurate and standardized measure of urbanicity across all countries and geographies would simplify predictions and inferences about human shopping behavior, media consumption, product affinities, and living conditions, for example, because it may be inferred that persons with similar urbanicity have, in some respects, similar characteristics. Measuring urbanicity, however, requires accurate counts of households per standard sized areas, including accounting for factors like whether someone lives at the boundary of a lake, forest, or arbitrary man-made boundaries such as states or countries, even without prior knowledge of the locations or existence of those boundaries. Such natural boundaries, if not taken into account, might indicate a lower urban density or urbanicity for an area than is in fact accurate; for example, if there is a high density population at a lakeshore, but the lake of course has a zero population density, then an area that includes both the lakeshore and the like will have an average population density that is highly misleading.

To better understand the potential value of a solution to this problem, it may be considered that demographic and propensity value coverage of households in the United States may run up to as many as 10,000 survey question answers. In other developed countries, such as Germany, the United Kingdom, France, and Australia, there may be hundreds of such answers available. On the other hand, most of the countries in the world have very little if any such information that is available. A means of bridging the paucity of the dataset for these countries would be highly valuable.

Each country may use different census-collecting approaches and thus are not standardized. In addition, data from different jurisdictions are not always available at the individual or household level. In fact, many countries have no publicly available, census-type data to access at all, thus making any attempt to apply urbanicity on a global scale a daunting proposition. If data is measured differently in one well-developed country, such as the United States, then one cannot infer anything about consumers in another country if census data and other data that may be informative with respect to urbanicity are not collected in the same manner, thus making an "apples to apples" comparison impossible. For example, the U.S. Census Bureau provides highly detailed information about populations based on Census-defined "block groups"; but this block group concept is not employed in any other country, and thus it is impossible to directly apply such data to whatever data may be available in another country in order to generate inferences.

A related problem is that each country has different measures for urbanicity. For example, the US Census Bureau divides urbanicity (population density) as falling into twelve different bands, or categories. France, Germany, and Italy use five, nine, and three different bands, respectively. The divisions between these bands are all defined differently. Many countries, such as Brazil, Mexico, and Australia, have no standardized public information available at all relating to urbanicity bands. Thus any attempt to standardize urbanicity across countries must also account for the problem of differing use (or no use) of population density bands.

To apply this baseline data from the United States to other countries, two different options may be considered. A first option is to simply acknowledge the shortfall in available data in the other countries of interest, and implement the solution where data is in fact relatively complete. This is an approach generally taken today. The solution may then be expanded to other countries as data becomes available, but leaves large gaps as long as information remains unavailable. Another option is to fill in data at the meta-level, where population counts by city are divided by the number of standard shapes (such as hexagons) that may be created in each city. This latter option is imprecise, but does provide at least some insight where no better data is available. Neither of these options, however, is entirely satisfactory. A problem with using shapes such as hexagons is that this approach does a poor job of accounting for natural boundaries. If, for example, a large city on an ocean shoreline falls into a given hexagon, the average population density across the hexagon may be relatively low due to the fact that no one lives in the ocean area, but this result produces an inaccurate reflection of actual urbanicity because the city portion of the hexagon may in fact be densely populated.

A machine and method for standardizing urbanicity data across countries or other defined regions in a surface that would allow inferences about consumers or other groups on the surface to be made globally, and that would accurately reflect urbanicity despite natural boundaries such as bodies of water, mountains, and the like or geographical/geopolitical boundaries, would therefore be highly desirable for numerous purposes.

SUMMARY OF THE INVENTION

The present invention is directed to a machine for and method of standardizing measures of urbanicity across various countries and other regions. The present invention accomplishes this task by the use of nested shapes drawn according to latitude and longitude coordinates. Because latitude and longitude are worldwide and measured the same everywhere, these can be used to provide a worldwide framework for measuring urbanicity. Using latitude and longitude information, shapes may be drawn to capture regions and define urbanicity within the region. The shapes in certain implementations are trapezoids lying within a certain latitude and longitude range, the shapes being curved to match the curvature of the earth's surface. For example, the San Francisco metropolitan area lies between 37° and 38° north latitude, and 122° and 123° west longitude. These latitude/longitude lines define a trapezoid with corners at the intersections of these lines, but the trapezoid is curved into the third spatial dimension due to the curvature of the earth. Of course metropolitan areas are not defined by latitude/longitude lines, and much of the area in this particular trapezoid is not within the San Francisco metropolitan area; in fact, a significant percentage of this trapezoid lies within the ocean. The invention in certain implementations addresses these sorts of natural boundaries as well as geographical boundaries such as state and country boundaries by employing multiple overlapping sizes of curved trapezoids.

It may be understood that if curved trapezoids are delineated by regular intervals in latitude and longitude, then the shapes will occupy different total areas depending upon their distance from the equator. Trapezoids closer to the poles will be narrower in the east-west direction because of the fact that longitude lines draw closer together as one approaches the poles, and therefore trapezoids or other shapes in higher (north or south) latitudes will be smaller in area. Therefore, the invention in certain implementations is further directed to a method of applying a multiplier component to these area shapes to account for the "shrinkage" in size of the areas as the area approaches the poles (i.e., as latitude values deviate further from 0° and closer to 90° north or south).

Although the invention in certain implementations is directed to human household counts, the invention is not so limited, and can apply to any other counts where population density is a matter of interest. This may include, for example, counts of cyber currency mining machines in an area.

These and other features, objects and advantages of the present invention will become better understood from a consideration of the following detailed description of the preferred embodiments and appended claims in conjunction with the drawings as described following:

DETAILED DESCRIPTION

The present invention will be described below with reference to one or more specific implementations; it is understood, however, that these implementations are not limiting to the invention, and the full scope of the invention is as will be set forth only in the claims.

Figure 1:
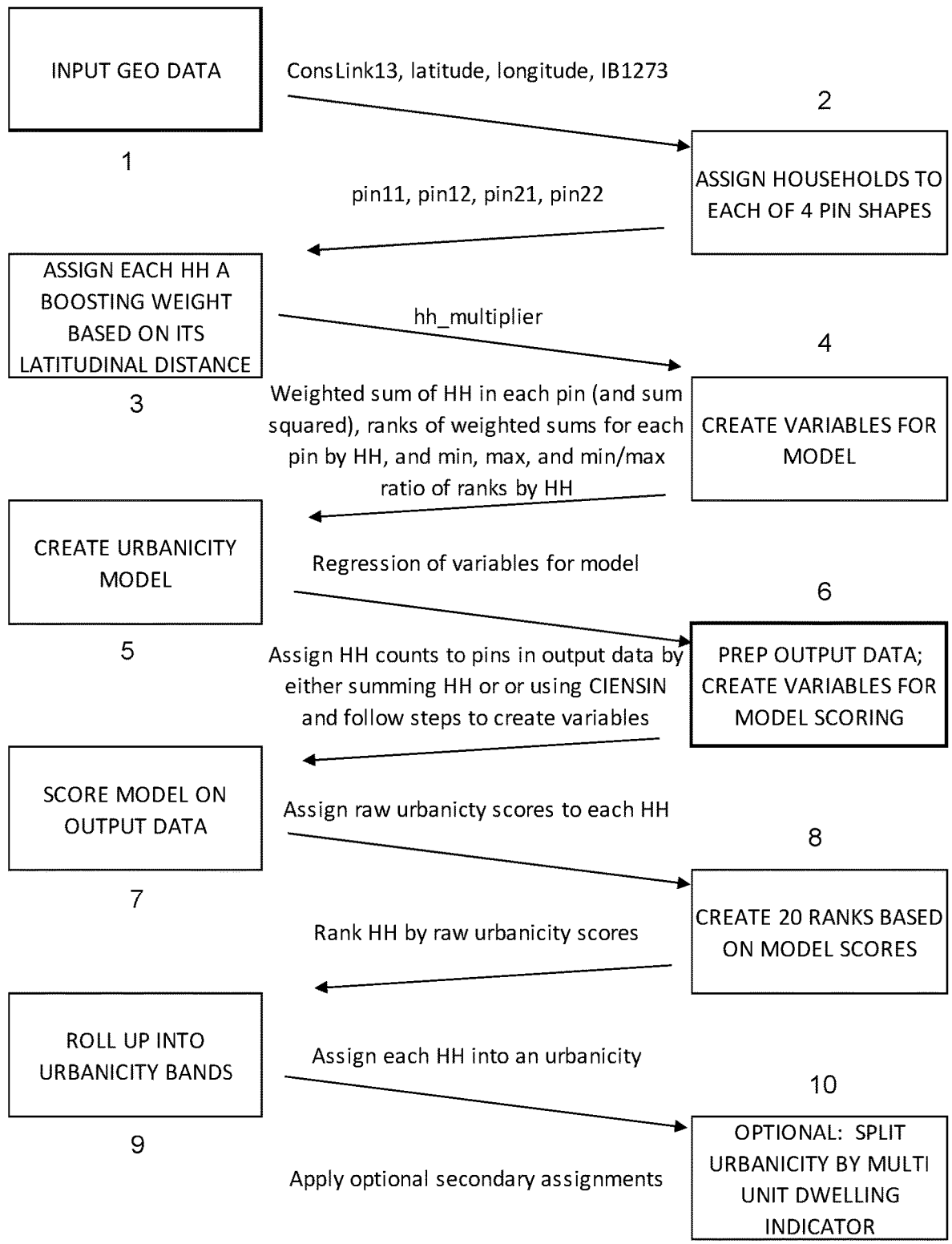
FIG. 1 is a flow chart depicting the order of steps in a method according to an implementation of the invention.

In overview, an implementation of the invention consists of the primary steps as illustrated in FIG. 1 (although these steps may be broken into multiple sub-steps as described more specifically below). In the input geo data step 1, the basic information is input to the system. Moving to assign households to each of four pin shapes step 2, four different trapezoid shapes ("pins") are built based on latitude/longitude boundaries. These are created using two different scales in each latitude/longitude direction, and thus there are four different shapes/sizes of trapezoids: a "big" trapezoid (larger scale in both latitude and longitude); a "tall" trapezoid (larger scale in latitude and smaller scale in longitude, referred to herein as $pin_{22}$); a "wide" trapezoid (smaller scale in latitude and larger scale in longitude); and a "small" trapezoid (smaller scale in both latitude and longitude). In one example, the scales are created by creating trapezoids using decimal latitude/longitude measurements, with the larger scale rounding to one decimal place and the smaller scale rounding to two decimal shapes.

In step 3, a multiplier is applied to adjust the count within a trapezoid to compensate for the fact that these trapezoids delineated by latitude/longitude lines will diminish in size as they approach the poles, and increase in size as they approach the equator. This is because longitude lines become closer together nearer the poles.

In step 4, variables for the model are created, including the weighted sum of households in each pin, and the corresponding sum squared; ranks of weighted sums for each pin type by household; and minimum, maximum, and minimum/maximum ratio of ranks by household.

At step 5, the urbanicity model is created, and regression of variables is performed for the model.

At step 6, output data is prepped and variables are created for model scoring. Outputs include the assignment of household counts to pins in output data by either summing households or using CIENSIN and following steps to create variables. Specifically, two particular examples are described herein of usable data sets, but the invention is not so limited. In one example, the InfoBase database maintained by Acxiom Corporation is used to provide household data in the United States. In another example, the CIESIN data from NASA is used.

At step 7, the model is scaled on the output data, and the raw urbanicity score are assigned to each household count.

At step 8, the counts are rolled up into urbanicity "bands" or levels as desired for a particular application. In one implementation described herein, the roll-up is used to create twenty urbanicity levels, each comprising 5% density brackets. In another implementation described herein, seven urbanicity levels are used: farm (the lowest 10% density); rural (the next 15%), town (the next 15%), exurb (the next 20%), suburb (the next 20%), city (the next 10%), and urban (the highest 10% of population density). The output is ranked households by urbanicity scores.

At step 9, the ranks are rolled up into urbanicity bands, with the output being an assignment of each household into an urbanicity.

Finally, at optional step 10, urbanicity is split if there is a multi-unit dwelling indicator, and optional secondary assignments are made if so.

With this overview, a particular implementation of the invention may now be described including certain sub-steps within these major steps as just described. To begin with, a data set containing household addresses in the US with the corresponding latitude, longitude, and known urbanicity is employed. This may be U.S. Census Bureau data divided into block groups from the US census, which will be referred to herein as the IB1273 data set. Ideally, this file would have national coverage to take advantage of a wide range of latitudes and urbanicities. From this data, the following data elements are created (note that the names of the data elements provided below are arbitrary):

a. lat1 is latitude rounded to 1 decimal place;
   b. long1 is longitude rounded to 1 decimal place;
   c. lat2 is latitude rounded to 2 decimal places; and
   d. long2 is longitude rounded to 2 decimal places.

Figure 2:
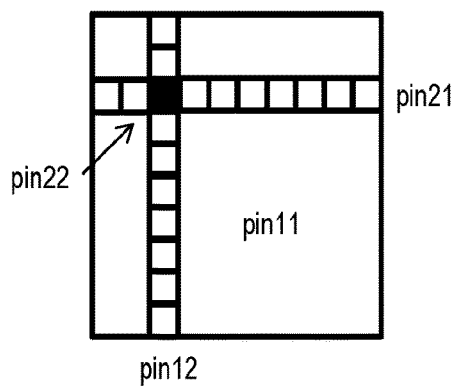
FIG. 2 is a depiction of pins (trapezoidal shapes) drawn on a surface according to an implementation of the invention.

As previously noted, these values will be referred to as "pins" to define four areas. The pin11 shape is the concatenation of lat1 and long1, which represents the "big" shape (which is roughly 11.132 km×11.132 km at the equator). An example of a pin11 value is "12.3_12.3". The pin12 shape is the concatenation of lat1_long2, which represents an area that is tall and skinny in shape (roughly 11.132 km×1.1132 km at the equator) and is geographically located inside pin11. An example of a pin12 value is "12.3_12.34". The pin21 shape is the concatenation of lat2_long1, which represents an area that is a wide and short shape (roughly 1.1132 km×11.132 km at the equator) and is geographically inside pin11. An example of a pin21 value is "12.34_12.3". The pin22 shape is the concatenation of lat2_long2, which represents an area that is small and is geographically inside pin11, pin 12, and pin 21 (roughly 1.1132 km×1.1132 km at the equator). An example of a pin22 value is "12.34_12.34". The relationship among these shapes is graphically illustrated in FIG. 2.

Next, each household is assigned a boosting weight based on its latitudinal distance from the equator. The boosting weight, which is referred to herein as "hh_multiplier", is calculated using an approximation as 110/((110−3*(absolute value of the latitude)/15) squared−(absolute value of latitude)/15). It can also be written as follows in Equations 1 and 2, with "shrink" calculated as an intermediate step because this value will be used in a later summation:

$$\text{shrink} = \left(110 - 3\frac{|\text{latitude}|}{15}\right)^2 - \frac{|\text{latitude}|}{15} \quad \text{Eq. 1}$$

$$hh_{multiplier} = \frac{1}{\text{shrink}/110} = \frac{110}{\text{shrink}} \quad \text{Eq. 2}$$

At the next step, the sum of households is calculated for each of pin11, pin12, pin21, and pin22. These sums can be stored in corresponding elements called hh1, hh12, hh21, and hh22. There are at least two primary sources of data that can be used as the basis for summing households for each pin shape. The most likely available data would be the analytic file used to this point. The process then is to simply sum the addresses. However, since this data would not likely account for all households in the entire world, a preferred option is to use data from another source that is more complete and then match those counts back to this analytic file. CIESIN data, which is collected by NASA and hosted at Columbia University, consists of population density estimates for latitude and longitude based on centroid coordinates. This data is then converted to the same pin shapes (curved trapezoids represented by pin11, pin12, pin21, and pin22) for use in assigning values to the corresponding elements hh1, hh12, hh21, and hh22 described herein.

Next, the previously defined hh_multiplier value is applied to each household count. This increases the raw counts based on distance away from the equator. These weighted sums can be stored in corresponding elements called hh11_wt, hh12_wt, hh21_wt, and hh22_wt. Additionally, the squares of the counts for each of these are calculated. The squares can be stored in corresponding elements called hh11_wt_sq, hh12_wt_sq, hh21_wt_sq, and hh22_wt_sq.

For each hh11_wt, hh12_wt, hh21_wt, and hh22_wt, the next sub-step is to calculate the rank of households by the counts into twenty breaks of 5% each. (Optionally, hh11_wt_sq, hh12_wt_sq, hh21_wt_sq, and hh22_wt_sq could be used instead, since they yield the same rank ordering). These ranks with values from 1 to 20 can be stored in corresponding elements called pop_density11, pop_density12, pop_density21, and pop_density22.

The next task is to find the maximum population density, minimum population density, and the minimum/maximum ratios. The value max_pop_density is the maximum urbanicity rank (most urban) from across pop_density11, pop_density12, pop_density21, and pop_density22. The value min_pop_density is the minimum urbanicity rank (least urban) from across pop_density11, pop_density12, pop_density21, and pop_density22. The value min_over_max_pop_density is the ratio of min_pop_density over max_pop_density.

Once this processing is complete, a regression model is built to predict IB1273 based on the following data elements:

hh22_wt hh21_wt hh12_wt hh11_wt
hh22_wt_sq hh21_wt_sq hh12_wt_sq hh11_wt_sq
pop_density11 pop_density12 pop_density21 pop_density22
max_pop_density, min_pop_density, min_over_max_pop_density.

The resulting model might look like the following, with the resulting predicted population densities stored in a data element called pop_density_raw.

pop_density_raw=13.42868+hh22_wt*0.00035618+
 hh21_wt*0.00009114+hh12_wt*0.00004767+
 hh11_wt*0.00000374+hh22_wt_sq*−
 0.00000000523929+hh21_wt_sq*−
 0.00000000043506+hh12_wt_sq*−
 0.00000000015016+hh11_wt_sq*−
 0.0000000000056024+pop_density11*0.09108+
 pop_density12*0.10001+
 pop_density21*0.08818+
 pop_density22*0.03525+max_pop_density*−
 1.07204+min_pop_density*1.35745+
 min_over_max_pop_density*−21.36822

It may be understood that other models may be used in alternative implementations of the invention using, for example, some subset of the variables used in the model just described. In fact, any subset of the variables may be used in various alternative implementations of the invention. Although accuracy may be reduced using such an approach, the resulting decrease in file size and computational requirements may be advantageous in certain implementations. Non-limiting examples of variable subsets that may be used in alternative models are as follows:

Alt Model 1: eliminate the hh22_wt_sq, hh21_wt_sq, hh12_wt_sq, and hh11_wt_sq values.

Alt Model 2: eliminate all but the hh22_wt, hh21_wt, hh12_wt, and hh11_wt values.

Alt Model 3: eliminate all but the pop_density11, pop_density12, pop_density21, and pop_density22 values.

Alt Model 4: eliminate the hh22_wt, hh21_wt, hh12_wt, hh11_wt, hh22_wt_sq, hh21_wt_sq, hh12_wt_sq, and hh11_wt_sq values.

Alt Model 5: eliminate all but the hh22_wt, hh21_wt, hh12_wt, hh11_wt, max_pop_density, and min_pop_density values.

Alt Model 6: eliminate all but the hh22_wt, hh21_wt, hh11_wt, and min_pop_density values.

Alt Model 7: eliminate all but the hh22_wt, hh21_wt, hh12_wt, hh11_wt, and min_pop_density values.

Alt Model 8: eliminate all but the hh22_wt, hh12_wt, hh11_wt, and min_pop_density values.

Alt Model 9: eliminate all but the hh21_wt and min_over_max_pop_density values.

Alt Model 10: eliminate all but the hh21_wt, hh21_wt_sq, and min_over_max_pop_density values.

Of these alternative models, the inventor hereof has found that Alt Model 10 is able to deliver the most accurate results relative to the other alternative models. This reflects the apparently high predictive quality of using the wide, short curved trapezoid shapes for modeling; using only these shapes generates results that are more than 90% as accurate as the full model using all four shapes and their related values.

After the pop_density_raw value is calculated using whichever model is desired, that value may be used to rank urbanicity into twenty groups numbered from 1 to 20, each representing 5% of the households, at reference numeral 18 in FIG. 1. This can be stored in a new data element called pop_density20. The cutoffs where pop_density_raw scores form each of the twenty groups can be used to assign these twenty ranks on any file with latitude and longitude. The groups can be further rolled up for various uses, such as into seven unequal groups with names such as pop_farm, pop_rural, pop_town, pop_exurb, pop_suburb, pop_city, pop_urban as follows.

If pop_density20=1 or pop_density20=2 then Pop_farm=1

If pop_density20=3 or pop_density20=4 or pop_density20=5 then Pop_rural=1

If pop_density20=6 or pop_density20=7 or pop_density20=8 then Pop_town=1

If pop_density20=9 or pop_density20=10 or pop_density20=11 or pop_density20=12 then Pop_exurb=1

If pop_density20=13 or pop_density20=14 or pop_density20=15 or pop_density20=16 then Pop_suburb=1

If pop_density20=17 or pop_density20=18 then Pop_city=1

If Pop_urban=0; if pop_density20=19 or pop_density20=20 then Pop_urban=1

Once the urbanicity assignments are made, then they may be applied to any database with latitude and longitude coordinates. Urbanicity is assigned by applying the model formula used to create pop_density_raw. The cutoffs where pop_density_raw scores formed each of the twenty groups can be used to assign the original twenty ranks of 5% each. Since the file being scored with these urbanicity assignments may not have the same distribution as the file used to build the model, it is expected that some skew may exist, meaning that the twenty groups may not contain 5% each. Depending on the use of urbanicity, it is possible to prefer to reassign (or recalibrate) the ranking assignments to force an even distribution.

A reliable way to assign urbanicity to places outside the U.S. is to use CIESIN data, which is collected by NASA and hosted at Columbia University. This data consists of population density estimates for latitude and longitude based on centroid coordinates. This data is then converted to the same pin shapes (curved trapezoids represented by pin11, pin12, pin21, and pin22) for use with the implementations described herein, where household-level data is replaced with this new data source at the centroid coordinate level. The same general steps are followed to create assignments.

An optional step is to further split urbanicity based on whether the address in question is a multi- or single-unit dwelling. This step, if used, of course requires knowledge from an applicable database about whether the household corresponds to a multi-unit or single-unit dwelling. This assignment can be approximate, such as flagging households with a second address line or addresses with "apt" in them as multi-unit dwellings, otherwise assuming single-unit dwelling. If, for example, there are seven population densities, they can be split by multi or single unit dwelling using the following names: Pop_farm_m, Pop_rural_m, Pop_town_m, Pop_exurb_m, Pop_suburb_m, Pop_city_m, Pop_urban_m, Pop_farm_s, Pop_rural_s, Pop_town_s, Pop_exurb_s, Pop_suburb_s, Pop_city_s, Pop_urban_s. The rationale for this step is to improve accuracy. For example, if a household is assigned pop_urban, which might be intended to represent the most urban areas, such as the heart of Manhattan, it might be preferable to split out addresses thought to be single-unit dwellings from those thought to be apartments. Likewise, households assigned as farms but having addresses making them appear to be apartment buildings are not truly the most rural.

An improvement to the implementation described above using CIESIN data can be achieved whereby the file size associated with the output is significantly reduced by keeping only records where pin11 is populated with non-zero values. There is no need to keep geographic areas with no households in them. Since most of the earth's surface is uninhabited, this offers the ability to shrink the database in a significant manner, and thereby reduce storage requirements and improve execution for all processing that takes place with this data set.

Another optional approach is to use an answer key in order to achieve data file size minimization. In this approach, an answer key is created where urbanity assignments are stored based on pin11, pin12, pin21, and pin22. Here as well, the approach keeps only records where pin11 is populated with non-zero values. There is no need to keep geographic areas with no households in them, and since much of the earth is uninhabited, this offers the ability to shrink the database size significantly. To apply the answer key to a database with latitude and longitude, one creates the pin22 values and matches them to the lookup to get the population density. An example of what a portion of the answer key in a particular example may look like, matching a subset of pin22 values to one of the twenty population density bands, is as follows:

pin22 pop_density20
32.65_−93.72 5
32.65_−93.79 1
32.65_−93.83 4
32.65_−93.89 1
32.65_−93.91 1
32.65_−93.92 1
32.65_−93.98 2
32.65_−94.34 1
32.65_−94.35 5
32.65_−94.39 6
32.65_−94.54 2
32.65_−94.57 4
32.65_−94.58 4
32.65_−94.61 2
32.65_−94.69 1

Figure 3:
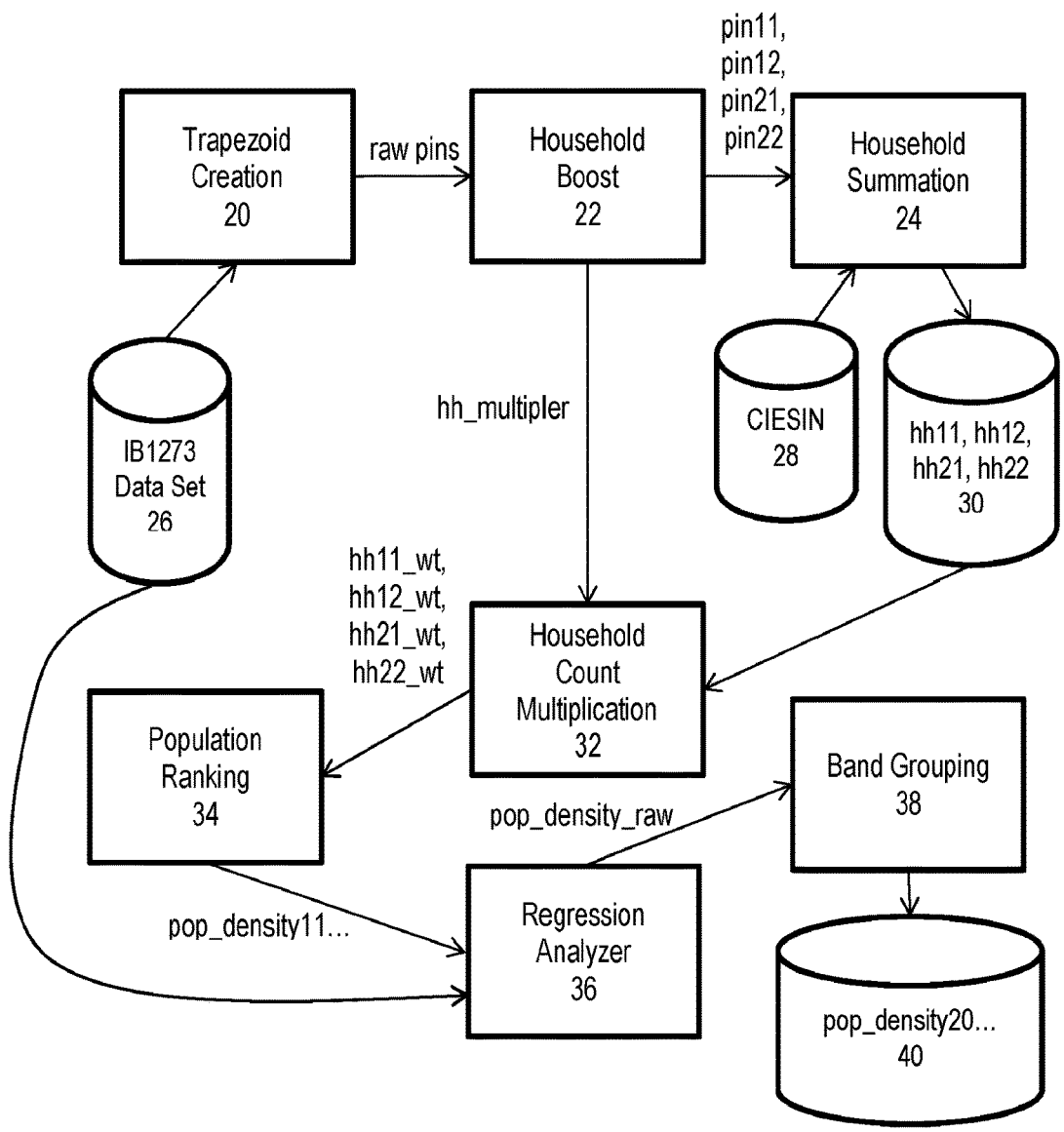
FIG. 3 is a depiction of logical components in a machine according to an implementation of the invention.

Referring now to FIG. 3, the logical components of a machine to implement the method just described may be set forth. Trapezoid creation block 20 uses IB1273 data set 26 to create the raw pins. These are fed to household boost block 22, which generates the pin11, pin12, pin21, pin 22 values for further calculations, and also passes along the hh_multiplier for later processing. Household summation block 24 uses CIESIN database 28 to perform the summations as described above, to produce hh11, hh12, hh21, and hh22 values, which are stored in household database 30. Household count multiplication block 32 uses the data from household database 30 and the hh_multiplier value to produce values for hh11_wt, hh12_wt, hh21_wt, and hh22_wt. These are passed to the population ranking block 34, which uses them to produce pop_density11, pop_density12, pop_density21, and pop_density22 values. (As well as other optional values as outlined above.) This data is passed to regression analyzer block 36, where the regression analysis is performed again using the IB1273 data set database 26.

Once this is complete, processing passes to band grouping block 30, which ultimately calculates pop_density20 values that allow for the division of population areas into bands, and this data is then stored for later processing and analysis at pop_density20 database 40.

The invention, in alternative implementations, may be used to measure population density on any three-dimensional surface. Other applications may include, by way of example and not limitation, crops, wildlife, white blood cells located on the surface of a tumor, or bacteria; essentially, anything with a surface where latitude and longitude assignments (or, more generally, any coordinate system of convenience) may be made related to population or other densities. Likewise, the invention may be used in video game or virtual world settings where population density of game characters in different digital locations replaces humans in real-world locations, as long as latitude and longitude assignments can be made to the game design and it conforms to the curved surface layout. Many "sand box" type games, for example, use spherical coordinates for the location of players, resources, and like game elements on a planet or other spherical surface.

In another implementation, it may be seen that the Internet of Things (IoT) may be used to detect urbanicity based on the location of IoT machines rather than the location of actual persons. In some examples, the location of persons may be inferred based on the location of the machines, or the location of the machines themselves may be of interest. This may lead to actions that IoT machines may take and information that they may send to other connected devices. It may be noted that in the case where the population density of the machines themselves is of interest, then the system may need an external source of counts of machines by each shape associated with a latitude and longitude area, similar to how the CIESIN data is used in one of the above examples concerning households. On the other hand, a strong advantage of working with IoT devices is that these devices often self-report their location, either directly as a latitude and longitude or in some form that could be converted to latitude and longitude; this data would be self-accumulating, so communications from the devices themselves could be used to understand how many devise are located in each "pin" (i.e., shape defined by latitude and longitude). It may also be noted that in the case of IoT devices, rather than calibrating to US census data the method could simply use the weights given by the "pop_density_raw" value as a default. Furthermore, it should be noted that in an IoT implementation, the concept of urbanicity may be quite different. For example, although farmland would be considered "rural" for humans due to the very low density of households in the associated region, a farm may in fact be an area of very high population density for IoT machines due to the presence, for example, of crop cameras, satellite-connected planting, irrigating, and harvesting equipment, unmanned aerial vehicles (UAVs) for the spraying of pesticides and/or herbicides, soil sampling machines, and the like. Another factor that is unique to the IoT implementation is that the urbanicity of an area can change throughout the day; whereas humans generally maintain a consistent household location, IoT devices are turned on and off at different times. For example, cameras used to monitor crops may be turned on at sunrise and turned off at sunset. Thus the urbanicity of IoT devices in an area can vary, perhaps dramatically, based on the time of day in the local area.

Another implementation of the invention pertains to blockchain technology. For example, an urbanicity measurement may be taken with respect to the number of nodes or "miners" of any particular cryptocurrency. This information may be valuable for various reasons. For example, if there are regions where nodes (i.e., high-performance computing facilities that form the backbone of a cryptocurrency network) are densely packed, then this may indicate that the blockchain system is at risk of being disrupted by war, political policies, or natural disasters affecting the densely packed node area. Likewise, knowledge of where the urbanicity of nodes is low may indicate opportunities for incentivizing miners to open new locations in these areas to improve the fault tolerance of the overall blockchain network. Knowledge of the locations where nodes are most densely packed could also be used for many other reasons, such as indicating areas where persons who work in this field may be more likely to find employment.

In one implementation of the invention, statistical analysis software (SAS) code may be used to implement the invention in a computing environment. In the following code example, the approach is used of summing on US households rather than using the CIESIN data, but it may be understood that the use of CIESIN data may be coded similarly following the description above.

Unless otherwise stated, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein. It will be apparent to those skilled in the art that many more modifications are possible without departing from the inventive concepts herein.

All terms used herein should be interpreted in the broadest possible manner consistent with the context. When a grouping is used herein, all individual members of the group and all combinations and sub-combinations possible of the group are intended to be individually included in the disclosure. All references cited herein are hereby incorporated by reference to the extent that there is no inconsistency with the disclosure of this specification. If a range is expressed herein, such range is intended to encompass and disclose all sub-ranges within that range and all particular points within that range.

The present invention has been described with reference to certain preferred and alternative embodiments that are intended to be exemplary only and not limiting to the full scope of the present invention, as set forth in the appended claims.

The invention claimed is:

1. A computerized method for standardizing urbanicity for a region of different countries on a curved surface, the method comprising the steps of:
   a. receiving from a computer-readable medium in communication with the one or more processors a set of map information, and constructing a plurality of shapes defined by latitude and longitude boundaries from the map information;
   b. adjusting a count associated with each of the plurality of shapes to compensate for the latitude of the shape to produce an adjusted count;
   c. calibrating census data from a country and applying the calibrated census data to the adjusted count;
   d. applying an external population data set to the adjusted counts to sum up the adjusted counts;
   e. rolling up each of the adjusted counts into one of a plurality of urbanicity bands, and applying one of the plurality of urbanicity bands to each of the plurality of shapes defined by latitude and longitude boundaries; and f. identifying whether one of the plurality shapes contains a multi-unit dwelling, and if so split out address in the multi-unit dwelling to improve accuracy of the adjusted count of the shape that contains the multi-unit dwelling by reassigning urbanicity bands.

2. The method of claim 1, wherein the plurality of shapes each comprise shapes in one of two different scales.

3. The method of claim 2, wherein the plurality of shapes comprises a shape with a large vertical scale and a large horizontal scale; a shape with a large vertical scale and a small horizontal scale; a shape with a small vertical scale and a large horizontal scale; and a shape with a small vertical scale and a small horizontal scale.

4. The method of claim 3, wherein the plurality of shapes comprise trapezoids.

5. The method of claim 1, wherein the calibrating census data step further comprises the step of calculating a maximum population density from the plurality of shapes and a minimum population density from the plurality of shapes.

6. The method of claim 5, further comprises application of a regression model to the adjusted counts to produce a raw population density.

7. The method of claim 1, further comprising the step of applying the plurality of urbanicity bands to the shapes using centroid-based population data for the region.

8. The method of claim 1, further comprising a step of eliminating all shapes corresponding to zero-population areas of the region prior to the step of summing up the adjusted counts.

9. A non-transitory computer-readable medium storing instructions to perform computerized method for standardizing urbanicity for a region of different countries on a curved surface, when executed by a computer, cause it to:

a. construct a plurality of trapezoidal shapes on the curved surface, wherein the trapezoidal shapes are defined by latitude and longitude boundaries;

b. adjust a count associated with each of the plurality of trapezoidal shapes to compensate for the latitude of the shape to produce an adjusted count;

c. calibrate census data from a country and apply the calibrated census data to the adjusted count;

d. apply an external population data set to the adjusted counts to sum up the adjusted counts;

e. roll up each of the adjusted counts into one of a plurality of urbanicity bands for each of the trapezoidal shapes; and f. identify whether one of the plurality trapezoidal shapes contains a multi-unit dwelling, and if so split out address in the multi-unit dwelling to improve accuracy of the adjusted count of the trapezoidal shape that contains the multi-unit dwelling by reassigning urbanicity bands.

10. The non-transitory computer-readable medium of claim 9, wherein the plurality of trapezoidal shapes each comprise one of two different scales in at least one dimension.

11. The non-transitory computer-readable medium of claim 10, wherein the plurality of trapezoidal shapes comprises a shape with a large vertical scale and a large horizontal scale; a trapezoidal shape with a large vertical scale and a small horizontal scale; a trapezoidal shape with a small vertical scale and a large horizontal scale; and a trapezoidal shape with a small vertical scale and a small horizontal scale.

12. The non-transitory computer-readable medium of claim 9, further comprising instructions that, when executed by a computer, calculate a maximum population density for the plurality of trapezoidal shapes and a minimum population density for the plurality of trapezoidal shapes.

13. The non-transitory computer-readable medium of claim 12, further comprising instructions that, when executed by a computer, apply a regression model to the adjusted counts to produce a raw population density.

14. The non-transitory computer-readable medium of claim 9, further comprising instructions that, when executed by a computer, apply the plurality of urbanicity bands to the shapes using centroid-based population data for the region.

15. The non-transitory computer-readable medium of claim 9, further comprising instructions that, when executed by a computer, eliminate all shapes corresponding to zero-population areas of the curved surface.

* * * * *